(12) United States Patent
Heo et al.

(10) Patent No.: US 8,071,977 B2
(45) Date of Patent: Dec. 6, 2011

(54) THIN FILM TRANSISTOR ARRAY PANEL AND MANUFACTURING METHOD THEREOF

(75) Inventors: Seong-Kweon Heo, Suwon-si (KR); Min-Chul Shin, Seoul (KR); Chang-Mo Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 148 days.

(21) Appl. No.: 12/535,887

(22) Filed: Aug. 5, 2009

(65) Prior Publication Data
US 2010/0200849 A1 Aug. 12, 2010

(30) Foreign Application Priority Data

Feb. 10, 2009 (KR) ........................ 10-2009-0010666

(51) Int. Cl.
*H01L 29/786* (2006.01)
*H01L 21/34* (2006.01)

(52) U.S. Cl. ....... 257/43; 257/59; 257/72; 257/E29.296; 257/E21.459

(58) Field of Classification Search .................. 257/43, 257/59, 57, 72, E29.296, E29.291, E33.004, 257/E21.414, E21.459
See application file for complete search history.

(56) References Cited

U.S. PATENT DOCUMENTS

| 2006/0071211 A1* | 4/2006 | Lee ................................ 257/59 |
| 2008/0142797 A1* | 6/2008 | Lee et al. ........................ 257/43 |

FOREIGN PATENT DOCUMENTS

| JP | 05-297408 | 11/1993 |
| JP | 2007-073563 | 3/2007 |
| KR | 1998-0012632 | 4/1998 |
| KR | 2002-0001424 | 1/2002 |
| KR | 2003-0077372 | 1/2003 |
| KR | 2003-0055501 | 7/2003 |
| KR | 10-2004-0061541 | 7/2004 |
| KR | 10-2005-0056234 | 6/2005 |
| KR | 1996-0032746 | 9/2006 |
| KR | 10-2007-0102969 | 10/2007 |

* cited by examiner

*Primary Examiner* — Victor A Mandala
*Assistant Examiner* — Whitney T Moore
(74) *Attorney, Agent, or Firm* — Innovation Counsel LLP (57) ABSTRACT

A thin film transistor and a manufacturing method thereof are provided. In the manufacturing method of the thin film transistor a semiconductive active layer and a semiconductor passivation layer are sequentially formed such that the semiconductor passivation layer protectively covers the semiconductive active layer. Then the stacked combination of the semiconductive active layer and semiconductor passivation layer are patterned by using a same patterning mask so that formed islands of the semiconductive active layer continue to be protectively covered by formed islands of the semiconductor passivation layer. In one embodiment, the semiconductive active layer is formed of a semiconductive oxide.

14 Claims, 6 Drawing Sheets

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2009-0010666 filed in the Korean Intellectual Property Office on Feb. 10, 2009, the entire contents of which application are incorporated herein by reference.

BACKGROUND (a) Field of Invention

The present disclosure of invention relates to a thin film transistor array panel and a manufacturing method thereof. More specifically, it relates to formation of thin film transistors having a semiconductive oxide layer as their active layer.

(b) Description of Related Technology

It has become desirable to make computer display monitors and televisions thin and lightweight, and pursuant to such desire, cathode ray tubes (CRT) are being replaced by liquid crystal displays (LCDs) or organic light emitting devices (organic light emitting diode (OLED) displays). The liquid crystal panel part of an LCD system is a light-shuttering non-emissive device while the organic light emitting device (OLED display) is a self-emissive device. However they both include a thin film transistor array panel having a thin film transistor provided as a switching element per each individually addressed pixel unit.

The thin film transistor typically includes an active switching region (e.g., a semiconductor region) defining a channel area disposed between source and drain areas. However electronic characteristics of the active switching region (e.g., of the semiconductor material) may be detrimentally changed by the specific photolithography and etching processes used for forming different thin films, and the performance of the thin film transistor may be correspondingly deteriorated when the characteristics of the active region are detrimentally changed. Particularly, in the case where the active switching region includes a semiconductive oxide, if the channel-defining layer is exposed to moisture (e.g., water vapor), or external contaminating ions, or to oxygen during the manufacturing process of the thin film transistor, a corresponding chemical oxidation or reduction reaction may occur and may cause the electrical conductivity characteristics of the semiconductive oxide region to be adversely changed.

The above information disclosed in this Background section is only for enhancement of understanding of the technological background and therefore it may contain information that does not form the prior art that is already known or recognized by persons of ordinary skill in the pertinent art.

SUMMARY

In accordance with the disclosure, exposure of the channel-defining portion of a semiconductive active region to moisture, or to external ions, or to oxygen is prevented or substantially reduced so as to thereby prevent or reduce deterioration of transistor switching performance.

A thin film transistor according to an exemplary embodiment includes: a substrate; a gate electrode disposed on the substrate; a gate insulating layer covering the gate electrode; a semiconductive oxide layer disposed on the gate insulating layer and having an island shape; a semiconductor-containing passivation layer disposed on the semiconductive oxide layer, the semiconductor-containing passivation layer includes first and second openings, and having substantially a same outer edge as the outer edge of the semiconductor layer. A source electrode and a drain electrode are disposed on the semiconductor passivation layer, and respectively contact the semiconductive oxide layer through the first and second openings. Here, the semiconductive oxide layer has a substantially same top-view shape (e.g., island shape) as the semiconductor passivation layer except for the regions that are exposed through the opening.

The semiconductive oxide layer may include a material selected from the group consisting of HfIZO (hafnium indium zinc oxide), GIZO (gallium indium zinc oxide), ZTO (zinc tin oxide), and ZnO (zinc oxide).

A thickness of the semiconductor layer may be in the range of 250 Å to 1000 Å.

A thickness of the semiconductor passivation layer may be in the range of 500 Å to 2500 Å.

The semiconductor passivation layer may be made of a silicon oxide (SiOx).

A manufacturing method of the thin film transistor according to an exemplary embodiment includes: forming a gate electrode on a substrate; forming a gate insulating layer on the gate electrode; sputter depositing a semiconductive oxide layer on the gate insulating layer; sputter depositing an insulating layer on the semiconductive oxide layer; simultaneously patterning the deposited semiconductive oxide layer and the insulating layer by use of as same mask to thereby form islands of semiconductive oxide material each covered by (and protected by) a same shaped island of the semiconductor passivation material; patterning through the thus-formed semiconductor passivation layer to thereby define first and second contact openings through the semiconductor passivation island to intended source and drain areas of the underlying semiconductive oxide island; and forming respective source drain electrodes on the semiconductor passivation island that extend through the first and second contact openings to contact the underlying areas of the semiconductive oxide island. The channel area of the semiconductive oxide island is thus continuously covered by the semiconductor passivation island during this process.

The forming of the source electrode and the drain electrode may include, in addition to the forming of a pair of openings in the patterned semiconductor passivation layer, depositing a conductor material that fills the pair of openings onto the semiconductor passivation layer, and patterning the conductor to thereby form the source and drain electrodes of respective semiconductive oxide transistors.

The deposition of the semiconductive oxide layer and the semiconductor-containing passivation layer may be each executed using a sputtering method.

The respective depositions of the semiconductive oxide layer and of the semiconductor-containing passivation layer may be executed under a continuous vacuum state so that the to-be-channel region of each transistor is prevented from being exposed to moisture or other performance deteriorating contaminants. The selective patterning of the semiconductive oxide and of the protective insulating layer by using one mask to form the stacked islands of semiconductive oxide material and the preliminary semiconductor passivation material may include forming a patterned photosensitive film layer by using the mask, selectively dry-etching through the insulating layer by using the photosensitive film pattern as an etch mask, and then selectively wet-etching through the semiconductive oxide layer by using the same patterned photosensitive film as an etch mask.

The patterning of the semiconductive oxide and the insulating layers by using the one common mask may define the substantially similar island shapes of the patterned semiconductive oxide layer and patterned semiconductor passivation layer.

The thickness of the semiconductive oxide layer may be in the range of 250 Å to 1000 Å.

The semiconductor passivation layer may be formed of SiOx.

According to the present disclosure, the semiconductive oxide and semiconductor passivation layers are thus sequentially deposited one on the next such that the semiconductive oxide is covered by the semiconductor passivation layer during the patterning process, and as a result, a to-be-channel portion of the semiconductive oxide layer may be prevented from being exposed to moisture, external ions, oxygen or other performance degrading chemicals.

DETAILED DESCRIPTION

More detailed descriptions are provided hereinafter with reference to the accompanying drawings, in which exemplary embodiments are shown. However, it is to be understood that the present teachings are not limited to the disclosed embodiments, but, on the contrary, they are intended to cover various modifications. As those skilled in the art would realize after appreciating the teachings, the described embodiments may be modified in various different ways, all without departing from the spirit or scope of the present disclosure of invention.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present. Like reference numerals designate like elements throughout the specification.

Figure 1:
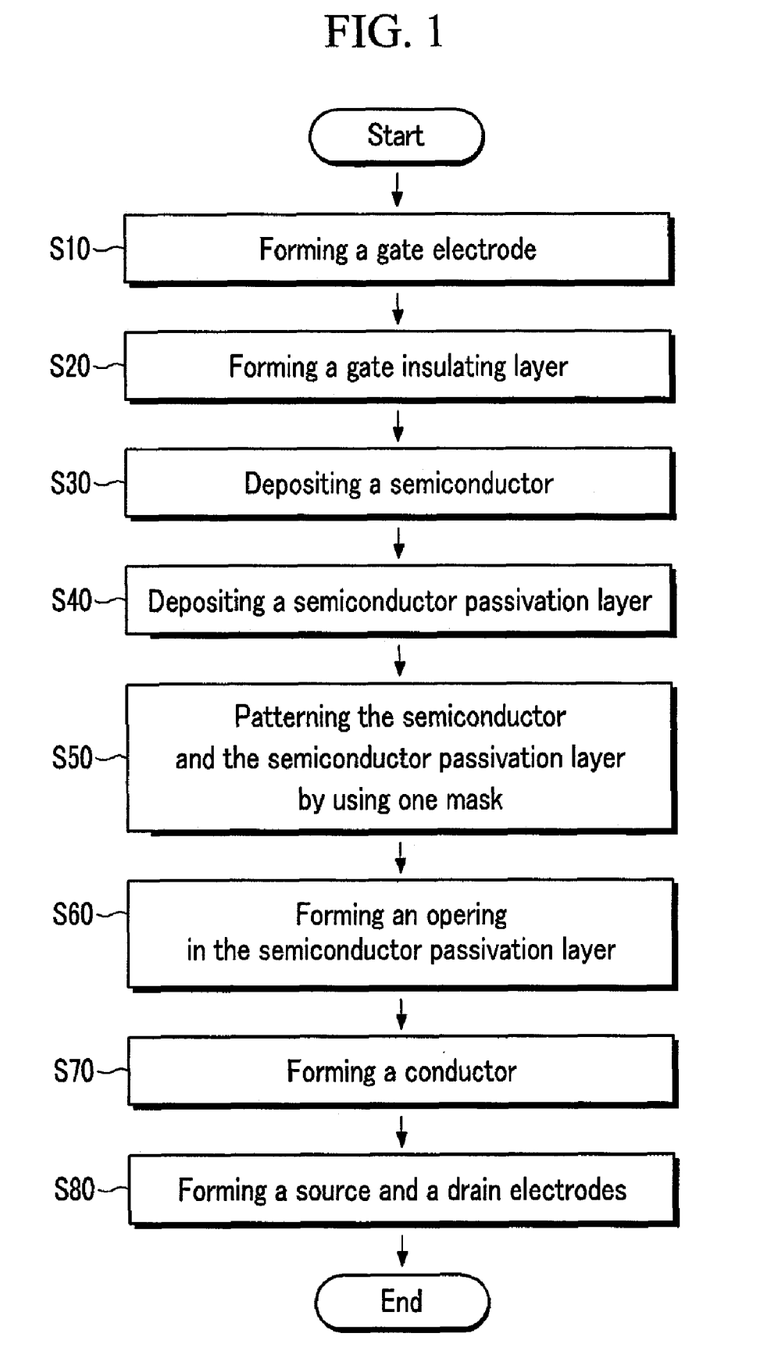
FIG. 1 is a flowchart showing a manufacturing method of a thin film transistor according to an exemplary embodiment of the present disclosure.

FIG. 1 is a flowchart showing a manufacturing method of a thin film transistor according to an exemplary embodiment.

Firstly, an electrically conductive gate electrode is formed on an electrically insulative substrate (step S10). In one embodiment, the substrate is a light-passing one such as glass or plastic.

The gate electrode may function as a control element in the to-be-formed switching transistor. In one embodiment, the gate electrode is used to draw charge carriers away from source and drain regions of a depletion mode operated, to-be-formed switching transistor.

Next, a gate insulating layer covering the gate electrode is formed (S20). In one embodiment, the gate insulating layer is made of an inorganic insulator and its thickness determines capacitive coupling between the gate electrode and the active layer of the transistor.

Next, a semiconductive active layer is deposited on the gate insulating layer (S30). Here, the semiconductive active layer may be composed of a semiconductive oxide.

If density of charge carriers in the body of the semiconductive active layer is appropriately managed, the semiconductive active layer may be made to have a relatively high turned-on current (Ion) when in a turned on state and a relatively low turned-off current (Ioff) when in a turned off state such that an excellent TFT characteristic including an acceptably high Ion/Ioff ratio may be obtained. The semiconductive oxide may be deposited through a sputtering method.

Next, a semiconductor passivation layer is formed on the semiconductive oxide layer (S40). In one embodiment, the semiconductor passivation layer is also deposited through a sputtering method. More specifically, the semiconductor passivation layer is deposited through a sputtering method instead of through a conventional Plasma Enhanced Chemical Vapor Deposition (PECVD) process in a manner such that the underlying semiconductive oxide layer may be substantially protected from being exposed to hydrogen (H2) during the deposition of the semiconductor passivation layer.

Next, the semiconductor passivation layer and the semiconductive oxide layer are patterned by using a single mask so that both appear as substantially same shaped, same dimensioned and stacked islands when seen in a top plan view (S50).

Next, openings are formed in the semiconductor passivation layer (S60).

Drain and source contact regions of the semiconductive oxide layer may be exposed through the openings.

Next, a conductor filling the openings is formed on the semiconductor passivation layer (S70).

Next, the conductor is patterned to form corresponding source and drain electrodes that are separated from each other (S80).

Figure 2:
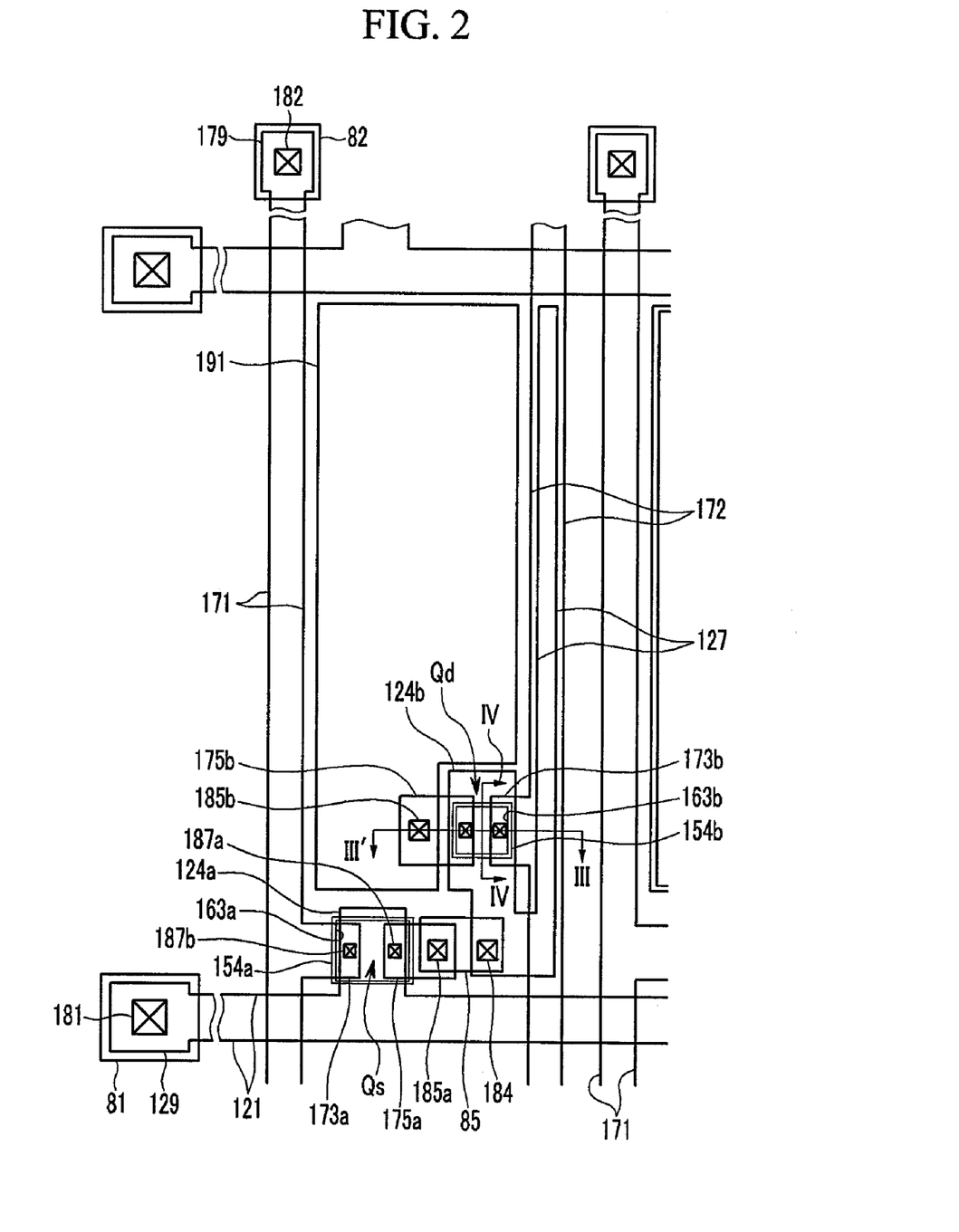
FIG. 2 is a layout view of a thin film transistor array panel according to an exemplary embodiment.

FIG. 2 is a layout view showing a thin film transistor array panel according to an exemplary embodiment.

Figure 3:
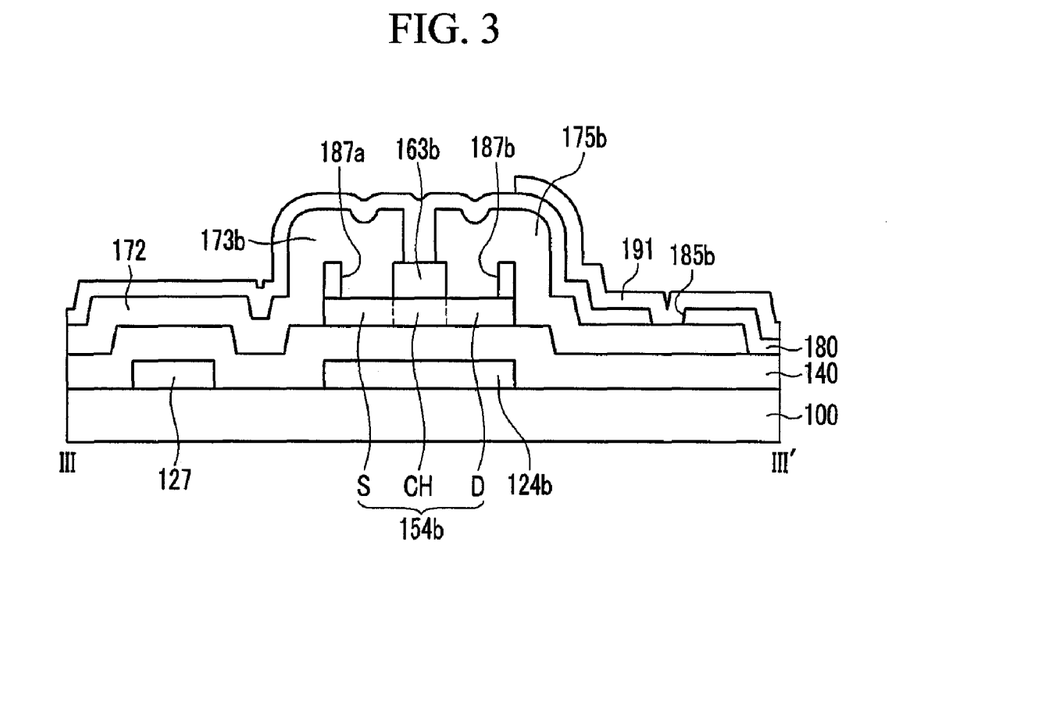
FIG. 3 is a cross-sectional view taken along the line III-III' of FIG. 2.
Figure 4:
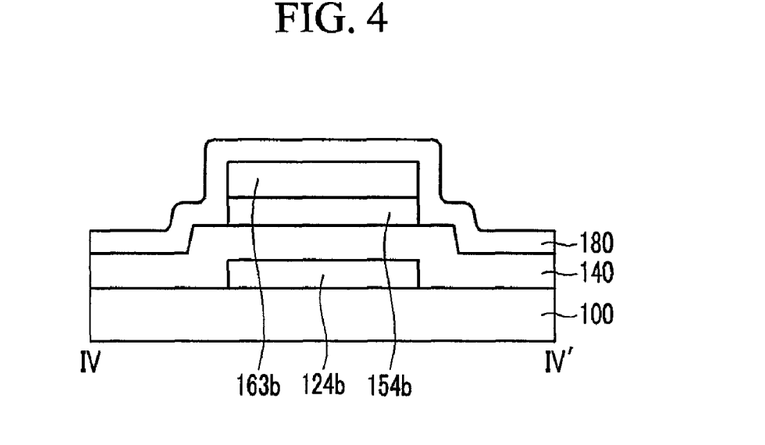
FIG. 4 is a cross-sectional view taken along the line IV-IV' of FIG. 2.

FIG. 3 is a cross-sectional view taken along the line III-III' of FIG. 2. FIG. 4 is a cross-sectional view taken along the line IV-IV' of FIG. 2.

Referring to FIG. 2 to FIG. 4, a plurality of gate conductors including a plurality of gate lines 121 and a plurality of second control electrodes 124b are formed on an insulating substrate 100 made of transparent glass or plastic. The gate lines 121 are used for transmitting gate signals and mainly extend in the transverse direction, and include first control electrodes 124a protruding upward and an end portion 129 having a large area for connection with another layer or an external driving circuit (not shown). The second control electrodes 124b are separated from the gate lines 121, and included in storage electrodes 127 extending in one direction. A gate insulating layer 140 is formed on the gate conductors 121 and 124b. The gate insulating layer 140 may be made of a silicon oxide (e.g., SiO2) and/or a silicon nitride (e.g., Si3N4).

A first semiconductor layer portion 154a and a second semiconductor layer portion 154b are formed and patterned on the gate insulating layer 140. The first semiconductor layer portion 154a overlaps the first gate electrode 124a, and the second semiconductor layer portion 154b overlaps the second gate electrode 124b. The first semiconductor layer 154a and the second semiconductor layer 154b may be each made of a semiconductive oxide. The semiconductive oxide may be composed of one or more of hafnium indium zinc oxide (HfIZO), gallium indium zinc oxide (GIZO), zinc tin oxide (ZTO), or zinc oxide (ZnO). The first semiconductor layer portion 154a and the second semiconductor layer portion 154b may be each formed in an island shape.

In one embodiment, the thickness of each of the first semiconductor layer portion 154a and the second semiconductor layer portion 154b is in the range of 250 Å to 1000 Å. If the thickness of the first semiconductor layer portion 154a and the second semiconductor layer portion 154b is more than 1000 Å, the on current (Ion) of the transistor turned-on state may be detrimentally decreased due to charge carrier mobility being undesirably deteriorated because the gate electrode is too far away from the surface where the source and drain terminals make contact. If the thickness of the first semiconductor layer portion 154a and the second semiconductor layer portion 154b is less than 250 Å, the off current (Ioff) may be undesirably increased due to inability of the gate electrode to draw charge carriers away from the surface where the source and drain terminals make contact and as a result, that the power consumption and turn-off reliability of the thin film transistor is deteriorated, and thereby it may be weak in terms of storing charge on a corresponding pixel-electrode.

Semiconductor passivation layer portions 163a and 163b respectively including a first opening 187a and a second opening 187b are respectively formed on the first semiconductive oxide layer portion 154a and the second semiconductive oxide layer portion 154b. In one embodiment, the semiconductor passivation layers 163a and 163b are composed of one or both of an oxide of silicon (SiOx) and a nitride of silicon (SiNy) or of a silicon oxynitrde (SiOxNy). In one embodiment, the semiconductor passivation layers are sputter deposited onto the semiconductive oxide layers. In one embodiment, the semiconductor passivation layers 163a and 163b are patterned with a same mask used to pattern the semiconductive oxide layer portion 154a and 154b so that the semiconductor passivation layers 163a and 163b substantially cover the underlying semiconductive oxide layer portion 154a and 154b (and more specifically, cover channel portions of 154a and 154b).

A plurality of data conductors including a plurality of data lines 171, a plurality of driving voltage lines 172, a plurality of source electrodes 173a and 173b, and a plurality of drain electrodes 175a and 175b are formed on the semiconductor passivation layers 163a and 163b and the gate insulating layer 140.

The data lines 171 are used to transfer data signals and they mainly extend in a longitudinal direction, thereby intersecting the gate lines 121. Each data line 171 includes a plurality of the first source electrodes 173a extending toward the first gate electrodes 124 and an end portion 179 with a wide area for connection with a different layer or an external driving circuit.

The driving voltage lines 172 are used to transfer driving voltages and mainly extend in a longitudinal direction, thereby intersecting the gate lines 121. Each driving voltage line 172 includes a plurality of the second source electrodes 173b extending toward the second gate electrodes 124b, and includes a portion overlapping the storage electrodes 127.

The first and second drain electrodes 175a and 175b are separated from each other, and the first drain electrodes 175a are separated from the data line 171 and the second drain electrodes 175b are separated from the driving voltage line 172. The first source electrode 173a and the first drain electrode 175a face each other on the first semiconductive layer portion 154a, and the second source electrode 173b and the second drain electrode 175b face each other on the second semiconductive layer portion 154b.

A passivation layer 180 is formed on the data conductors 171, 172, 173a, 173b, 175a, and 175b. In one embodiment, the passivation layer 180 is composed of an inorganic insulator. In an alternate embodiment, the passivation layer 180 is composed of an organic insulator. The passivation layer 180 has contact holes 182, 185a, and 185b defined therethrough for exposing the end portions 179 of the data lines 171, and the first and second drain electrodes 175a and 175b. Also, the passivation layer 180 and the gate insulating layer 140 have a plurality of contact holes 181 and 184 exposing the end portions 129 of the gate lines 121, and the second source electrodes 173b. A plurality of pixel electrodes 191, a plurality of connecting members 85, and a plurality of contact assistants 81 and 82 are formed on the passivation layer 180.

The pixel electrodes 191 are connected to the second drain electrodes 175b through the contact holes 185b, the connecting members 85 connect the second gate electrode 124b to the first drain electrode 175a through the contact holes 184 and 185a, and the contact assistants 81 and 82 are connected to the end portions 129 and 179 of the gate lines 121 and the data lines 171 through the contact holes 181 and 182.

In FIG. 2, the neighboring data lines 171, the neighboring driving voltage lines 172, and the neighboring gate line 121 define boundaries of a corresponding pixel area, and the defined pixel area includes a switching thin film transistor Qs, a driving thin film transistor Qd, and a storage capacitor.

In detail, in the switching thin film transistor Qs, the first source electrode 173a is connected to the data line 171, the first gate electrode 124a is connected to the gate line 121, and the switching thin film transistor Qs selectively conducts the data signal transmitted through the data line 171 to the drive transistor Qd in response to the gate signal transmitted through the gate line 121 being at a transistor turning-on voltage level. When the gate signal transmitted through the gate line 121 is at a transistor turning-off voltage level, the switching thin film transistor Qs should be substantially nonconductive.

In the driving thin film transistor Qd, the second drain electrode 175b is connected to the pixel electrode 191 through the contact hole 185b, and the second source electrode 173b is connected to the driving voltage line 172. Strapping member 85 couples the first drain electrode 175a of Qs to the second gate electrode 124b of Qd.

The storage electrode 131 that is patterned along with the second gate electrode 124b forms a capacitor along with the driving voltage line 172, and stores the driving voltage.

Next, details of the driving thin film transistor Qd according to an exemplary embodiment will be described.

The second semiconductive oxide layer portion 154b includes a source region S, a drain region D, and a channel region CH. The channel region CH is disposed between the source region S and the drain region D. The source region S is defined at least by a source terminal (173b) making contact with one region of the top major surface of the semiconductive oxide layer portion 154b. The drain region D is defined at least by a drain terminal (175b) making contact with a spaced apart second region of the top major surface of the semiconductive oxide layer portion 154b.

The semiconductor passivation layer 163b is disposed on the second semiconductive oxide layer portion 154b. The semiconductor passivation layer 163b may have an island shape. Here, the top-plan view shape of the outer edge of the semiconductor passivation layer 163b may be the same as that of the outer edge of the semiconductive oxide layer 154b. The semiconductor passivation layer 163b has the first opening 187a and the second opening 187b respectively exposing the source region S and the drain region D at the top major surface of the semiconductive oxide layer portion 154b. The second source electrode 173b and the second drain electrode 175b that are separated from each other are disposed on the semiconductor passivation layer 163b.

The thickness of the semiconductor passivation layer 163b may be in the range of 500 Å to 2500 Å. Particularly, in one embodiment, the thickness of the semiconductor passivation layer 163b is about 1500 Å. When the thickness of the semiconductor passivation layer 163b is less than 500 Å or more than 2500 Å, the characteristics of the thin film transistor may be deteriorated.

The second source electrode 173b is contacted with the source region S through the first opening 187a, and the second drain electrode 175b is contacted with the drain region D through the second opening 187b.

The passivation layer 180 covering the second source electrode 173b and the second drain electrode 175b is formed on the substrate 100. Referring to FIG. 4, a portion of the passivation layer 180 may be contacted with sidewalls of the second semiconductive oxide layer 154b. The second drain electrode 175b is connected to the pixel electrode 191 through the contact hole 185b formed in the passivation layer 180.

FIG. 5 to FIG. 9 are cross-sectional views of a thin film transistor array panel in the manufacturing method according to an exemplary embodiment, taken along the line III-III' of FIG. 2.

Figure 5:
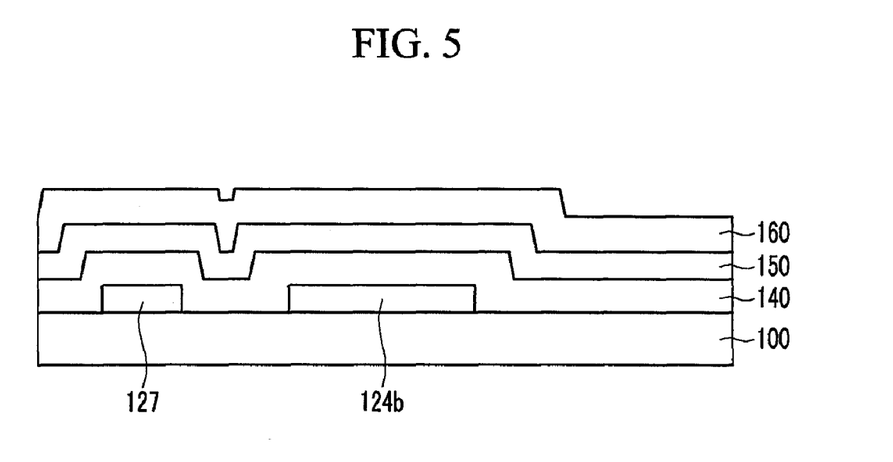
FIG. 5 to FIG. 9 are cross-sectional views of a thin film transistor array panel in the manufacturing method according to an exemplary embodiment taken along the line III-III' of FIG. 2.

Referring to FIG. 5, a first conductive material (not fully shown, could be metal and/or another electrically conductive material) is blanket formed on a substrate 100 made of glass or plastic, and is patterned to form a gate electrode 124b. A gate insulating layer 140 made of a silicon oxide or a silicon nitride and is deposited to cover the gate electrode 124b and exposed other areas on the substrate 100. A semiconductive oxide layer 150 and an insulating layer 160 are sequentially deposited on the gate insulating layer 140.

The sequential deposition of the semiconductive oxide 150 and the insulating layer 160 will now be described in detail.

The semiconductive oxide layer 150 may be made of a semiconductive oxide material such as HfIZO (hafnium indium zinc oxide), GIZO (gallium indium zinc oxide), ZTO (zinc tin oxide), or ZnO (zinc oxide), and it is deposited on the gate insulating layer 140 through a sputtering method. Next, the insulating layer 160 is deposited on the semiconductor 150 through a sputtering method. In one embodiment, the insulating layer 160 is formed of a semiconductor passivation material such as a silicon oxide (SiOx).

Both of the semiconductive oxide layer 150 and the insulating layer 160 are sequentially deposited through sputtering methods such that the semiconductive oxide layer 150 is prevented from being exposed to harmful moisture during inter-deposition cleaning which may occur after formation of the semiconductive oxide layer but before deposition of the insulating layer 160. Thanks to the protective insulating layer 160, and the conductivity of the semiconductive oxide layer 150 may be later prevented from being undesirably increased by H2 generated during subsequent deposition through a PECVD process. Particularly, in an exemplary embodiment, when depositing the semiconductive oxide layer 150 and the insulating layer 160, the substrate 100 is continuously vacuum-transported inside the same sputtering apparatus between sputtering stations such that the semiconductive oxide layer 150 may be prevented from being exposed to moisture, or contaminating external ions, or oxygen at least until after the protective, insulating layer 160 covers it.

The thickness of the semiconductive oxide layer 150 may be in the range of 250 Å to 1000 Å. After patterning the semiconductive oxide layer 150, if the thickness of the post-patterning region 154b is more than 1000 Å, the on current (Ion) tends to be undesirably decreased due to lack of sufficient numbers of mobile charge carriers in the surface region between the source and drain contacts. On the other hand, if the thickness of the semiconductor layer 154b is less than 250 Å, the off current (Ioff) tends to be undesirably increased due to inability of the gate electrode to draw away sufficient numbers of mobile charge carriers from the surface region between the source and drain contacts and as a result, the reliability of the thin film transistor is deteriorated and thereby it may be weak in terms of storage of static electricity.

The thickness of the insulating layer 160 may be in the range of 500 Å to 2500 Å. Particularly, in one embodiment, the thickness of the insulating layer 160 is about 1500 Å.

Figure 6:
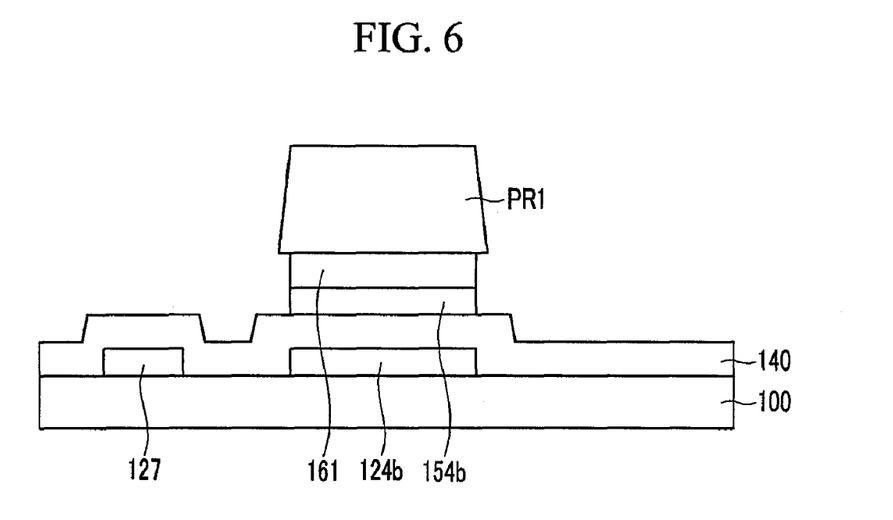

Referring to FIG. 6, the insulating layer 160 and the semiconductive oxide layer 150 are patterned through a photolithography process. That is, a photosensitive film is formed on the insulating layer 160, and is exposed and developed by using a mask to form a first photosensitive film pattern PR1. The insulating layer 160 and the semiconductor 150 are etched by using the first photosensitive film pattern PR1 as an etch mask to form a preliminary semiconductor passivation layer 161 and a semiconductive oxide layer region 154b each with the island shape (when viewed from above). Here, undesired portions of the insulating layer 160 are removed by dry-etching, and undesired portions of the semiconductive oxide layer 150 are removed by subsequent wet-etching. Accordingly, the semiconductor layer 151 and the preliminary semiconductor passivation layer 161 have the substantially the same shape when seen from a top-plan view.

Figure 7:
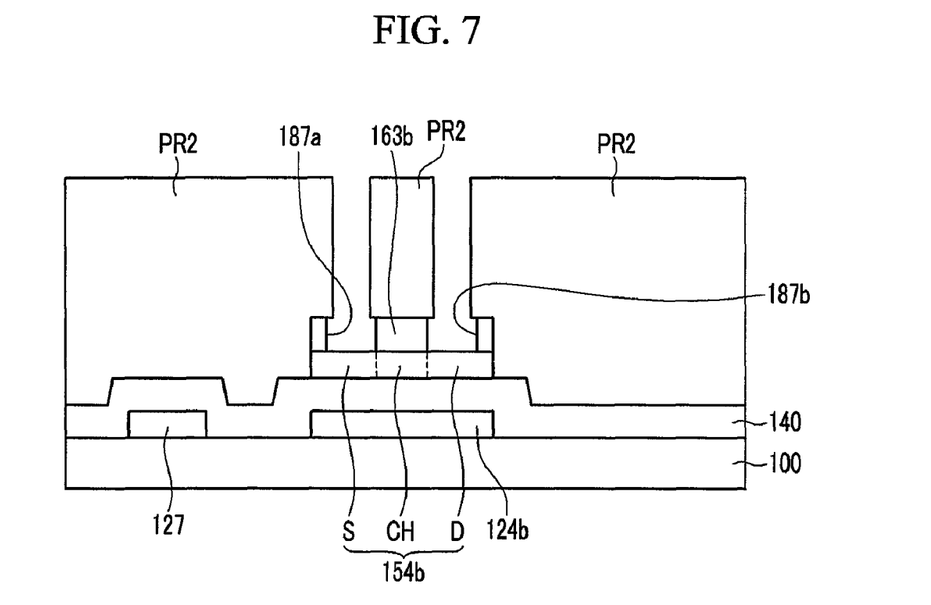

Referring to FIG. 7, the preliminary semiconductor passivation layer 161 is further patterned by using a second photosensitive film pattern PR2 through a photolithography process to form the first opening 187a and the second opening 187b and complete a semiconductor passivation layer 163b over the transistor channel region CH. After forming the first opening 187a and the second opening 187b, the second photosensitive film pattern PR2 is selectively removed.

Figure 8:
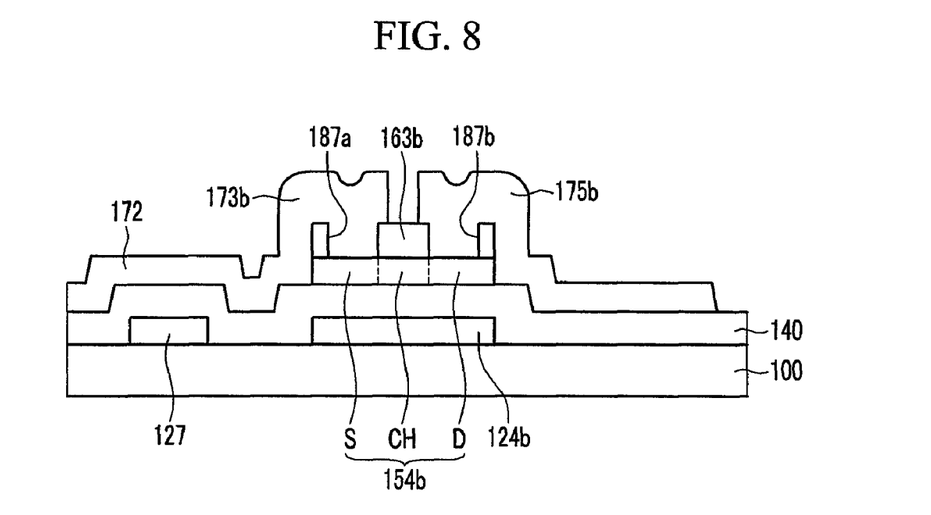

Referring to FIG. 8, a conductor (not shown) covering the semiconductor passivation layer 163b is formed on the substrate 100. The conductor may be made of a refractory metal such as molybdenum, chromium, tantalum, titanium, or alloys thereof, and may have a multilayered structure including the refractory metal layer (not shown) and a conductive layer (not shown) having low resistance. Also, the conductor may be made of a metal having the low resistance such as an aluminum-containing metal including aluminum (Al) or an aluminum alloy, a silver-containing metal including silver Ag) or a silver alloy, and a copper-containing metal including copper (Cu) or a copper alloy. The conductor (not shown) is patterned by a photolithography process to form a source electrode 173b and a drain electrode 175b that are separated from each other.

Figure 9:
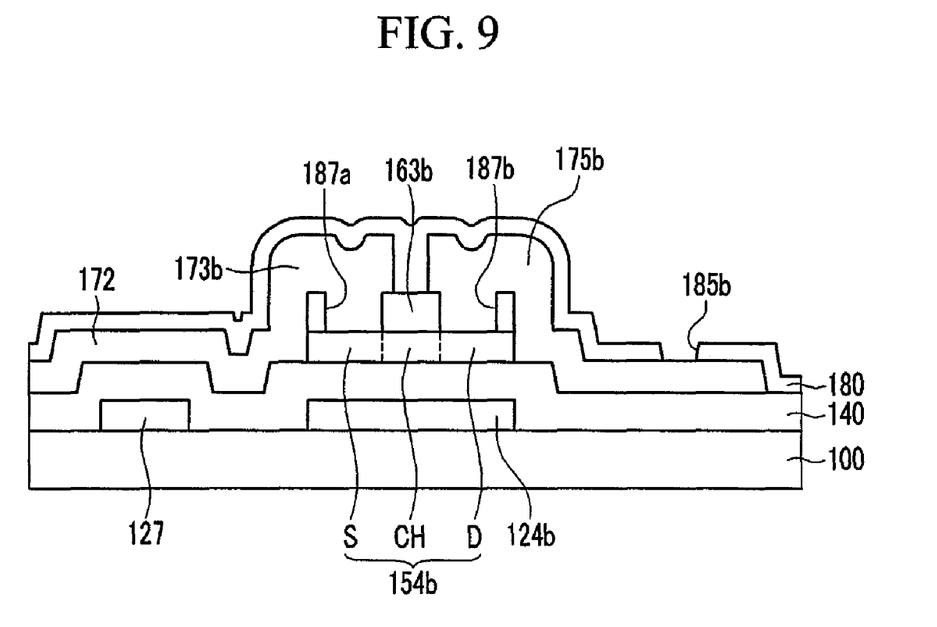

Referring to FIG. 9, a passivation layer 180 (e.g., one made of an inorganic insulator or of an organic insulator) covering the source electrode 173b and the drain electrode 175b is formed on the substrate 100. As shown in FIG. 3, the passivation layer 180 is patterned to form a contact hole 185b exposing a portion of the drain electrode 175b, and a pixel electrode 191 electrically connected to the drain electrode 175b through the contact hole 185b is formed on the passivation layer 180.

While these teachings have been presented in connection with what is presently considered to be practical exemplary embodiments, it is to be understood that the teachings are not limited to the disclosed embodiments, but, on the contrary, they are intended to cover various modifications and equivalent arrangements included within the spirit and scope of the over all disclosure.

What is claimed is:

1. A thin film transistor array panel comprising:
   a substrate;
   a plurality of thin film transistors formed on the substrate, where each thin film transistor of said plurality of thin film transistors comprises:
   a gate electrode disposed over the substrate;
   a gate insulating layer covering the gate electrode;
   a semiconductive active layer portion disposed on the gate insulating layer;
   a semiconductor passivation layer disposed on the semiconductive active layer, the semiconductor passivation layer having first and second openings;
   a source electrode and a drain electrode respectively disposed on the semiconductor passivation layer, the source electrode and the drain electrode respectively contacting corresponding source and drain portions of the semiconductive active layer portion respectively through the first and second openings; and
   a covering passivation layer disposed on the source electrode and the drain electrode, the covering passivation layer contacts the semiconductive active layer portion.

2. The thin film transistor array panel of claim 1, wherein the semiconductive active layer portion includes at least one semiconductive oxide material selected from the group consisting of HfIZO (hafnium indium zinc oxide), GIZO (gallium indium zinc oxide), ZTO (zinc tin oxide), and ZnO (zinc oxide).

3. The thin film transistor array panel of claim 1, wherein a thickness of the semiconductive active layer is in the range of 250 Å to 1000 Å.

4. The thin film transistor array panel of claim 1, wherein a thickness of the semiconductor passivation layer is in the range of 500 Å to 2500 Å.

5. The thin film transistor array panel of claim 1, wherein the semiconductor passivation layer is made of a silicon oxide (SiOx).

6. The thin film transistor array panel of claim 1 wherein the covering passivation layer has a third opening.

7. The thin film transistor array panel of claim 6, further comprising a pixel electrode disposed on the passivation layer and connected to the drain electrode through the third opening.

8. The thin film transistor array panel of claim 1, wherein the covering passivation layer makes contact with a sidewall of the semiconductive active layer portion.

9. The thin film transistor array panel of claim 1, wherein the semiconductive active layer portion has an island shape with an outer edge, and
   the semiconductor passivation layer has substantially a same outer edge as the outer edge of the semiconductive active layer portion.

10. The thin film transistor array panel of claim 1, wherein the semiconductive active layer portion has a first outer edge,
    the semiconductor passivation layer has a second outer edge, and
    the second outer edge is equivalent to the first outer edge in a plan view of the thin film transistor array panel.

11. A thin film transistor array panel comprising:
    a substrate;
    a plurality of thin film transistors formed on the substrate and including a first thin film transistor, where the first thin film transistor comprises:
    a gate electrode disposed over the substrate;
    a gate insulating layer covering the gate electrode;
    a semiconductive active layer portion disposed on the gate insulating layer and having a first outer edge;
    a semiconductor passivation layer disposed on the semiconductive active layer, the semiconductor passivation layer having first and second openings, the semiconductor passivation layer further having a second outer edge, the second outer edge being equivalent to the first outer edge in a plan view of the thin film transistor array panel; and
    a source electrode and a drain electrode respectively disposed on the semiconductor passivation layer, the source electrode and the drain electrode respectively contacting corresponding source and drain portions of the semiconductive active layer portion respectively through the first and second openings.

12. The thin film transistor array panel of claim 11, wherein the second outer edge is perpendicular to a top surface of the semiconductive active layer portion in a cross-sectional view of the thin film transistor array panel.

13. The thin film transistor array panel of claim 11, wherein the semiconductive active layer portion further has a third outer edge,
    the semiconductor passivation layer further has a fourth outer edge, and
    the fourth outer edge is equivalent to the third outer edge in a plan view of the thin film transistor array panel.

14. The thin film transistor array panel of claim 13, wherein the fourth outer edge is perpendicular to a top surface of the semiconductive active layer portion in a cross-sectional view of the thin film transistor array panel.

* * * * *